United States Patent
Arik et al.

(10) Patent No.: US 9,651,318 B2
(45) Date of Patent: May 16, 2017

(54) SYNTHETIC JET EMBEDDED HEAT SINK

(71) Applicant: General Electric Company, Schenectady, NY (US)

(72) Inventors: Mehmet Arik, Uskudar Istanbul (TR); Yogen Vishwas Utturkar, Niskayuna, NY (US); Mustafa Gursoy, Sogutozu Ankara (TR)

(73) Assignee: General Electric Company, Schenectady, NY (US)

( * ) Notice: Subject to any disclaimer, the term of this patent is extended or adjusted under 35 U.S.C. 154(b) by 771 days.

(21) Appl. No.: 13/852,422

(22) Filed: Mar. 28, 2013

(65) Prior Publication Data
US 2013/0213618 A1  Aug. 22, 2013

Related U.S. Application Data (62) Division of application No. 12/261,478, filed on Oct. 30, 2008, now Pat. No. 8,453,715.

(51) Int. Cl.
| | |
|---|---|
| *F28F 9/24* | (2006.01) |
| *H01L 23/467* | (2006.01) |
| *F28F 13/00* | (2006.01) |

(52) U.S. Cl.
CPC ............... *F28F 9/24* (2013.01); *F28F 13/00* (2013.01); *H01L 23/467* (2013.01); *H01L 2924/0002* (2013.01)

(58) Field of Classification Search
CPC ......... F28D 15/0266; F28F 3/02; F28F 3/022; F28F 2250/08; F28F 9/24; H01L 2929/0002; H01L 2929/00; H01L 23/467; H01L 23/3677; H01L 292/0002; H01L 292/004; F04D 33/00; F04D 25/16; F04D 25/166; H05K 7/20136; F21V 29/02
USPC ............ 165/80.3, 121, 104.34; 361/695, 697
See application file for complete search history.

(56) References Cited

U.S. PATENT DOCUMENTS

| | | | |
|---|---|---|---|
| 5,369,301 A * | 11/1994 | Hayashi et al. | ............... 257/722 |
| 5,758,823 A | 6/1998 | Glezer et al. | |
| 5,927,385 A | 7/1999 | Yeh | |
| 5,943,209 A | 8/1999 | Liu | |
| 5,988,522 A | 11/1999 | Glezer et al. | |
| 6,179,046 B1 | 1/2001 | Hwang et al. | |
| 6,313,399 B1 | 11/2001 | Suntio et al. | |
| 6,496,368 B2 * | 12/2002 | Jui-Yuan | ........................ 361/697 |
| 6,633,484 B1 | 10/2003 | Lee et al. | |
| 6,817,405 B2 * | 11/2004 | Kamath et al. | ............... 165/80.3 |
| 7,193,849 B2 | 3/2007 | Xu et al. | |
| 7,204,615 B2 | 4/2007 | Arik et al. | |

(Continued)

*Primary Examiner* — Tho V Duong
(74) *Attorney, Agent, or Firm* — Ziolkowski Patent Solutions Group, SC; Jean K. Testa (57) ABSTRACT

A system and method for cooling heat-producing devices using synthetic jet embedded heat sinks is disclosed. The cooling system includes a heat sink comprising a base portion and a plurality of fins disposed on the base portion and extending vertically out therefrom, the plurality of fins spaced to define a channel between adjacent fins. The cooling system also includes at least one synthetic jet actuator attached to the heat sink, with each of the at least one synthetic jet actuators comprising a plurality of orifices therein and being configured to generate and project a series of fluid vortices out from the plurality of orifices and toward at least a portion of the channels of the heat sink.

14 Claims, 6 Drawing Sheets

(56) References Cited

U.S. PATENT DOCUMENTS

| | | |
|---|---|---|
| 7,252,140 B2 | 8/2007 | Glezer et al. |
| D573,111 S | 7/2008 | Liu et al. |
| D593,512 S | 6/2009 | Lin |
| 7,543,961 B2 | 6/2009 | Arik et al. |
| 7,556,406 B2 | 7/2009 | Petroski et al. |
| 7,607,470 B2 | 10/2009 | Glezer et al. |
| D603,810 S | 11/2009 | Yang et al. |
| D619,548 S | 7/2010 | Liu |
| D619,549 S | 7/2010 | Liu |
| D622,675 S | 8/2010 | Liu |
| 8,033,324 B2 * | 10/2011 | Mukasa et al. ............. 165/80.3 |
| 8,120,908 B2 * | 2/2012 | Arik et al. .................... 361/694 |
| 2002/0185269 A1 * | 12/2002 | Sato ............................. 165/185 |
| 2004/0256085 A1 * | 12/2004 | Barsun et al. ............... 165/80.3 |
| 2006/0050482 A1 * | 3/2006 | Glezer et al. ................. 361/691 |
| 2006/0185822 A1 | 8/2006 | Glezer et al. |
| 2006/0196638 A1 | 9/2006 | Glezer et al. |
| 2007/0012429 A1 | 1/2007 | Siu |
| 2007/0119575 A1 * | 5/2007 | Glezer et al. ........... 165/104.33 |
| 2007/0169928 A1 | 7/2007 | Dayan et al. |
| 2008/0137289 A1 | 6/2008 | Arik et al. |
| 2009/0084866 A1 | 4/2009 | Grimm et al. |
| 2010/0038056 A1 | 2/2010 | Ellsworth et al. |
| 2010/0258270 A1 | 10/2010 | Arik et al. |

\* cited by examiner

SYNTHETIC JET EMBEDDED HEAT SINK

CROSS-REFERENCE TO RELATED APPLICATION

The present application is a divisional of and claims priority to U.S. application Ser. No. 12/261,478, filed Oct. 30, 2008, the disclosure of which is incorporated herein.

BACKGROUND OF THE INVENTION

Embodiments of the invention relate generally to thermal management systems and, more particularly, to an apparatus and method for cooling high power-density, heat-producing devices using synthetic jet embedded heat sinks.

Cooling of heat-producing devices is a concern in many different technologies. Particularly in microprocessors, the rise in heat dissipation levels associated with increasingly powerful processing system has resulted in the need for new cooling solutions beyond conventional thermal management techniques. This has led to an increased demand for advanced and robust cooling solutions with severe volume constraints. In the microelectronics industry, for example, advances in technology have brought about an increase in transistor density and faster electronic chips. As electronic packages increase in speed and capability, the heat flux that must be dissipated to maintain reasonable chip temperatures has also risen.

One conventional means for dissipating heat is by way of a heat sink, which can be placed on an electronic package to draw heat away therefrom. While air-cooling under natural convection conditions by way of a heat sink is the simplest possible way to cool a high heat flux device, high power dissipation requirements often necessitate the use of fans. Typically, these fans are placed either directly on the heat sink or are positioned to drive airflow through the heat sink by way of a duct in the heat sink. While fans have the capacity to move a substantial volume of air, they are noisy, unreliable, and generally very inefficient in terms of the heat removed for a given electrical input power.

Arrays of air-jets have also been used in cooling applications as an alternative to fans. However, conventional air-jets are not very useful for consumer products, due to requirements of pressure supplies and conduits for directing the air to the heat sink. This makes design of the cooling system too complex and the cost of the cooling system too high for consumer product applications.

Accordingly, there is a need for a system and method for cooling heat-producing devices in an efficient manner. There is a further need for such a system to have minimal space requirements and a simplified, cost-effective design.

BRIEF DESCRIPTION OF THE INVENTION

Embodiments of the invention overcome the aforementioned drawbacks by providing a system and method for cooling high power-density, heat-producing devices using synthetic jet embedded heat sinks. The synthetic jet embedded heat sinks provide a compact, reliable mechanism for cooling having a small footprint. The synthetic jet embedded heat sinks further have a high flux and provide an efficient system for air-cooling heat-producing devices.

In accordance with one aspect of the invention, a cooling system includes a heat sink comprising a base portion and a plurality of fins disposed on the base portion and extending vertically out therefrom, the plurality of fins spaced to define a channel between adjacent fins. The cooling system also includes at least one synthetic jet actuator attached to the heat sink, with each of the at least one synthetic jet actuators comprising a plurality of orifices therein and being configured to generate and project a series of fluid vortices out from the plurality of orifices and toward at least a portion of the channels of the heat sink.

In accordance with another aspect of the invention, a method of cooling a heat generating device includes the steps of providing a heat sink comprising a plurality of fins positioned to define a plurality of channels in the heat sink, attaching a synthetic jet actuator to the plurality of fins, the synthetic jet actuator having a plurality of orifices formed therein, and generating a series of fluid vortices from the synthetic jet actuator. The method also includes the step of projecting the series of fluid vortices out from the plurality of orifices of the synthetic jet actuator and toward the plurality of fins and channels of the heat sink, wherein the series of fluid vortices are projected out from the plurality of orifices toward the plurality of fins and channels of the heat sink at a plurality of angles.

In accordance with yet another aspect of the invention, a cooling system includes a heat sink comprising a base portion and a plurality of fins disposed on the base portion and extending vertically out therefrom to define a plurality of channels, wherein the plurality of fins are positioned on the base portion to surround a central channel. The cooling system also includes a synthetic jet actuator integrally attached to the heat sink and positioned in the central channel, the synthetic jet actuator further including a chamber having walls enclosing a volume, a plurality of orifices formed in the walls, and an actuator element coupled to at least one of the walls to selectively cause deflection thereof, thereby changing a volume within the chamber so that a series of fluid vortices are generated and projected out from the plurality of orifices and toward the plurality of channels of the heat sink.

These and other advantages and features will be more readily understood from the following detailed description of preferred embodiments of the invention that is provided in connection with the accompanying drawings.

BRIEF DESCRIPTION OF THE DRAWINGS

The drawings illustrate embodiments presently contemplated for carrying out the invention.

In the drawings.

DETAILED DESCRIPTION OF THE PREFERRED EMBODIMENT

Figures 1, 2:
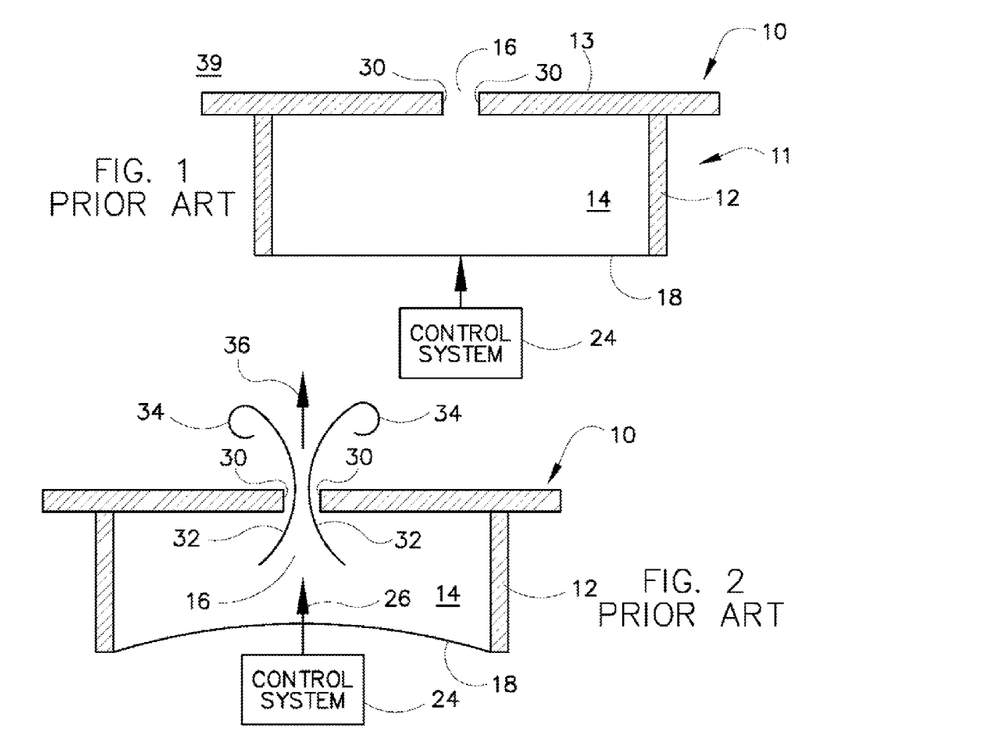
FIG. 1 is a cross-section of a prior art zero net mass flux synthetic jet actuator with a control system.
FIG. 2 is a cross-section of the synthetic jet actuator of FIG. 1 depicting the jet as the control system causes the diaphragm to travel inward, toward the orifice.
Figure 3:
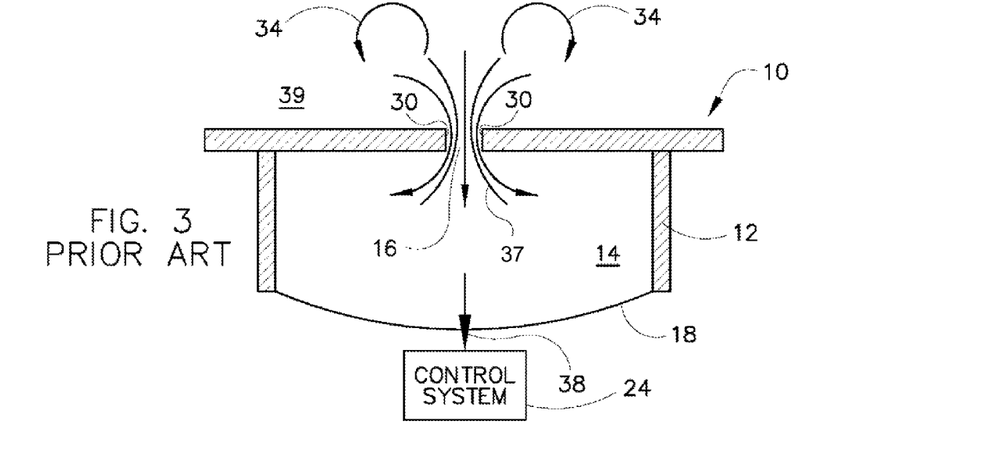
FIG. 3 is a cross-section of the synthetic jet actuator of FIG. 1 depicting the jet as the control system causes the diaphragm to travel outward, away from the orifice.

Referring to FIGS. 1-3, a synthetic jet actuator 10 as known in the art, and the operation thereof, is shown for purposes of describing the general operation of a synthetic jet actuator. The synthetic jet actuator 10 includes a housing 11 defining and enclosing an internal chamber 14. The housing 11 and chamber 14 can take virtually any geometric configuration, but for purposes of discussion and understanding, the housing 11 is shown in cross-section in FIG. 1 to have a rigid side wall 12, a rigid front wall 13, and a rear diaphragm 18 that is flexible to an extent to permit movement of the diaphragm 18 inwardly and outwardly relative to the chamber 14. The front wall 13 has an orifice 16 of any geometric shape. The orifice diametrically opposes the rear diaphragm 18 and connects the internal chamber 14 to an external environment having ambient fluid 39.

The flexible diaphragm 18 may be controlled to move by any suitable control system 24. For example, the diaphragm 18 may be equipped with a metal layer, and a metal electrode may be disposed adjacent to but spaced from the metal layer so that the diaphragm 18 can be moved via an electrical bias imposed between the electrode and the metal layer. Moreover, the generation of the electrical bias can be controlled by any suitable device, for example but not limited to, a computer, logic processor, or signal generator. The control system 24 can cause the diaphragm 18 to move periodically, or modulate in time-harmonic motion, and force fluid in and out of the orifice 16. Alternatively, a piezoelectric actuator could be attached to the diaphragm 18. The control system would, in that case, cause the piezoelectric actuator to vibrate and thereby move the diaphragm 18 in time-harmonic motion.

The operation of the synthetic jet actuator 10 is described with reference to FIGS. 2 and 3. FIG. 2 depicts the synthetic jet actuator 10 as the diaphragm 18 is controlled to move inward into the chamber 14, as depicted by arrow 26. The chamber 14 has its volume decreased and fluid is ejected through the orifice 16. As the fluid exits the chamber 14 through the orifice 16, the flow separates at sharp orifice edges 30 and creates vortex sheets 32 which roll into vortices 34 and begin to move away from the orifice edges 30 in the direction indicated by arrow 36.

FIG. 3 depicts the synthetic jet actuator 10 as the diaphragm 18 is controlled to move outward with respect to the chamber 14, as depicted by arrow 38. The chamber 14 has its volume increased and ambient fluid 39 rushes into the chamber 14 as depicted by the set of arrows 37. The diaphragm 18 is controlled by the control system 24 so that when the diaphragm 18 moves away from the chamber 14, the vortices 34 are already removed from the orifice edges 30 and thus are not affected by the ambient fluid 39 being drawn into the chamber 14. Meanwhile, a jet of ambient fluid 39 is synthesized by the vortices 34 creating strong entrainment of ambient fluid drawn from large distances away from the orifice 16.

Figure 4:
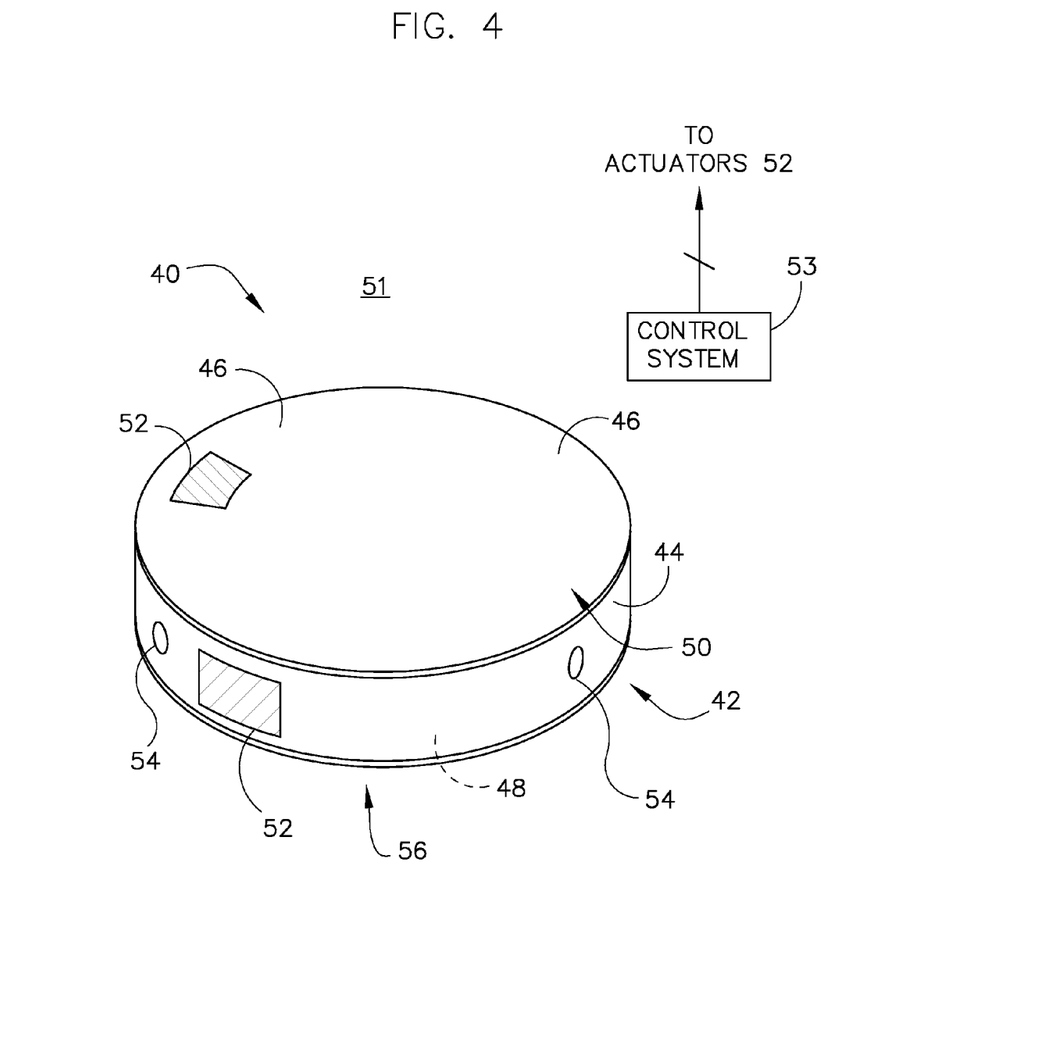
FIG. 4 is an illustration of a synthetic jet actuator for use with a cooling system, according to an embodiment of the invention.

Referring now to FIG. 4, a synthetic jet actuator 40 for use with an embodiment of the invention is shown. According to the embodiment, synthetic jet actuator 40 is configured as a disc-shaped synthetic jet actuator that includes a wall structure 42 having an unbroken, or continuous outer bounding surface or wall 44, having generally cylindrical profile, along with a top surface or wall 46 and a bottom surface or wall 48. Thus, a generally disc-shaped jet actuator 40 is formed having an enclosed volume, chamber or cavity 50 that is separate from the environment 51 external to the volume 50.

As shown in FIG. 4, synthetic jet actuator 40 includes one or more actuator elements, micromechanical devices, or piezomotive devices 52 that are positioned on one or all surfaces 44, 46, 48. Outer surface 44 and top surface 46 are shown as having actuators 52 attached thereto. Although actuators 52 are illustrated as covering only a portion of the respective surfaces 44, 46, embodiments of the invention include one or more actuators 52 configured to cover the entire respective surfaces 44, 46, 48 on which they are placed. Actuators 52 may be activated by application of a rapidly alternating voltage that causes the actuators 52 to rapidly expand and contract and may be monomorph or bimorph devices. A control system 53 is coupled to actuators 52, and it is recognized that each actuator 52 includes a control system (not shown) for activation. Further, it is recognized that one control system 53 may be used to actuate more than one actuator 52.

In embodiments of the invention, actuators 52 may include devices other than piezoelectric motive devices such as shape-memory alloys, magnetic materials, electrostatic materials, hydraulic materials, and ultrasonic materials. Thus, in such embodiments, control system 53 is configured to activate actuators 52 in corresponding fashion. That is, for an electrostatic material, controller 53 may be configured to provide a rapidly alternating electrostatic voltage to actuators 52 in order to activate and flex surfaces 44, 46, 48 to which actuators 52 are attached. Such additional materials may themselves be configured in monomorph and bimorph arrangements.

As further shown in FIG. 4, orifices 54 are formed within outer surface 44 and are positioned in order to direct fluid emitting therefrom (based on activation of actuators(s) 52) at desired locations and at an object (not shown) positioned proximate to or around the synthetic jet actuator 40. That is, orifices 54 can be dispersed about an outer perimeter 56 of synthetic jet actuator 40 (i.e., outer surface 44), to emit fluid at a number of different angles. The orifices 54 could, for example, be located at every 45 degrees or every 90 degrees around the outer surface 44, so as to provide uniform and circumferential cooling to the object/component by way of the plurality of orifices 54.

Although the synthetic jet actuator 40 of FIG. 4 is illustrated having a disc shape, the invention described herein is not limited thereto. One skilled in the art will recognize that the synthetic jet actuator 40 is not limited to a disc shape, but could also be shaped as an oval, a square, a rectangle, an ellipse, and the like, depending on the application, and orifices 54 may be positioned accordingly, depending on the convective cooling and placement requirements of the application.

Figure 5:
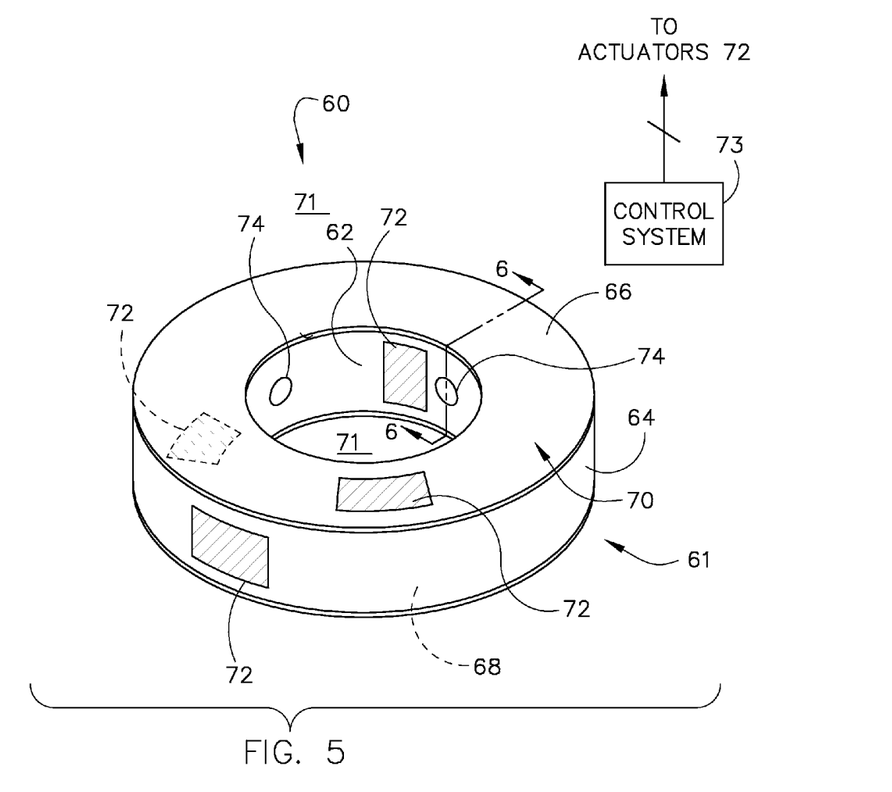
FIG. 5 is an illustration of a synthetic jet actuator for use with a cooling system, according to another embodiment of the invention.

Referring now to FIG. 5, a synthetic jet actuator 60 for use with another embodiment of the invention is shown. According to the embodiment, synthetic jet actuator 60 is configured as a toroid- or circular-shaped synthetic jet actuator surrounding a hollow central opening. In this embodiment, synthetic jet actuator 60 includes a wall structure 61 having an unbroken, or continuous inner bounding surface or wall 62 and an unbroken, or continuous outer bounding surface or wall 64, both having generally cylindrical profiles. The inner surface 62 and the outer surface 64 are joined together via a top surface or wall 66 and a bottom surface or wall 68.

Figure 6:
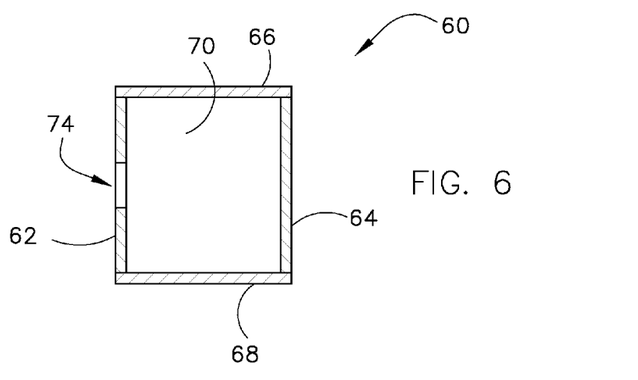
FIG. 6 is a cross-section of the synthetic jet actuator of FIG. 5.

That is, as shown in the cross-sectional view of a portion of synthetic jet 60 in FIG. 6, inner and outer walls or surfaces 62, 64, coupled to top and bottom surfaces 66, 68, enclose a volume 70. Orifices 74 pass through surface 62. Thus, a generally toroid-shaped jet 60 is formed having an enclosed volume, chamber or cavity 70 that is separate from the environment 71 external to the volume 70.

Referring again to FIG. 5, synthetic jet actuator 60 includes one or more actuator elements, micromechanical devices, or piezomotive devices 72 that are positioned on one or all surfaces 62, 64, 66, 68. Inner surface 62, outer surface 64, and top surface 66 are all shown as having actuators 72 attached thereto. Although actuators 72 are illustrated as covering only a portion of the respective surfaces 62, 64, 66, embodiments of the invention include one or more actuators 72 configured to cover the entire respective surfaces 62, 64, 66, 68 on which they are placed. Actuators 72 may be activated by application of a rapidly alternating voltage that causes the actuators 72 to rapidly expand and contract and may be monomorph or bimorph devices. A control system 73 is coupled to actuators 72, and it is recognized that each actuator 72 includes a control system (not shown) for activation. Further, it is recognized that one control system 73 may be used to actuate more than one actuator 72.

In embodiments of the invention, actuators 72 may include devices other than piezoelectric motive devices such as shape-memory alloys, magnetic materials, electrostatic materials, hydraulic materials, and ultrasonic materials. Thus, in such embodiments, control system 73 is configured to activate actuators 72 in corresponding fashion. That is, for an electrostatic material, controller 73 may be configured to provide a rapidly alternating electrostatic voltage to actuators 72 in order to activate and flex surfaces 62, 64, 66, 68 to which actuators 72 are attached. Such additional materials may themselves be configured in monomorph and bimorph arrangements.

The one or more orifices 74, illustrated as positioned within surface 62, may be positioned in order to direct fluid emitting therefrom at desired locations and at an object (not shown) positioned proximate the synthetic jet actuator 60. That is, synthetic jet actuator 60 is configured to encircle or surround an object or component that could benefit from cooling air being directed thereto via the orifices 74, and provide uniform and circumferential cooling to the object/component by way of the plurality of orifices 74 positioned in surface or wall 62.

Although the synthetic jet actuator 60 of FIG. 5 is illustrated having a toroid shape, the invention described herein is not limited thereto. One skilled in the art will recognize that the synthetic jet actuator 60 is not limited to a toroid shape, but could also be shaped as an oval, a square, a rectangle, an ellipse, and the like, depending on the application, and orifices 74 may be positioned accordingly, depending on the convective cooling and placement requirements of the application.

Figure 7:
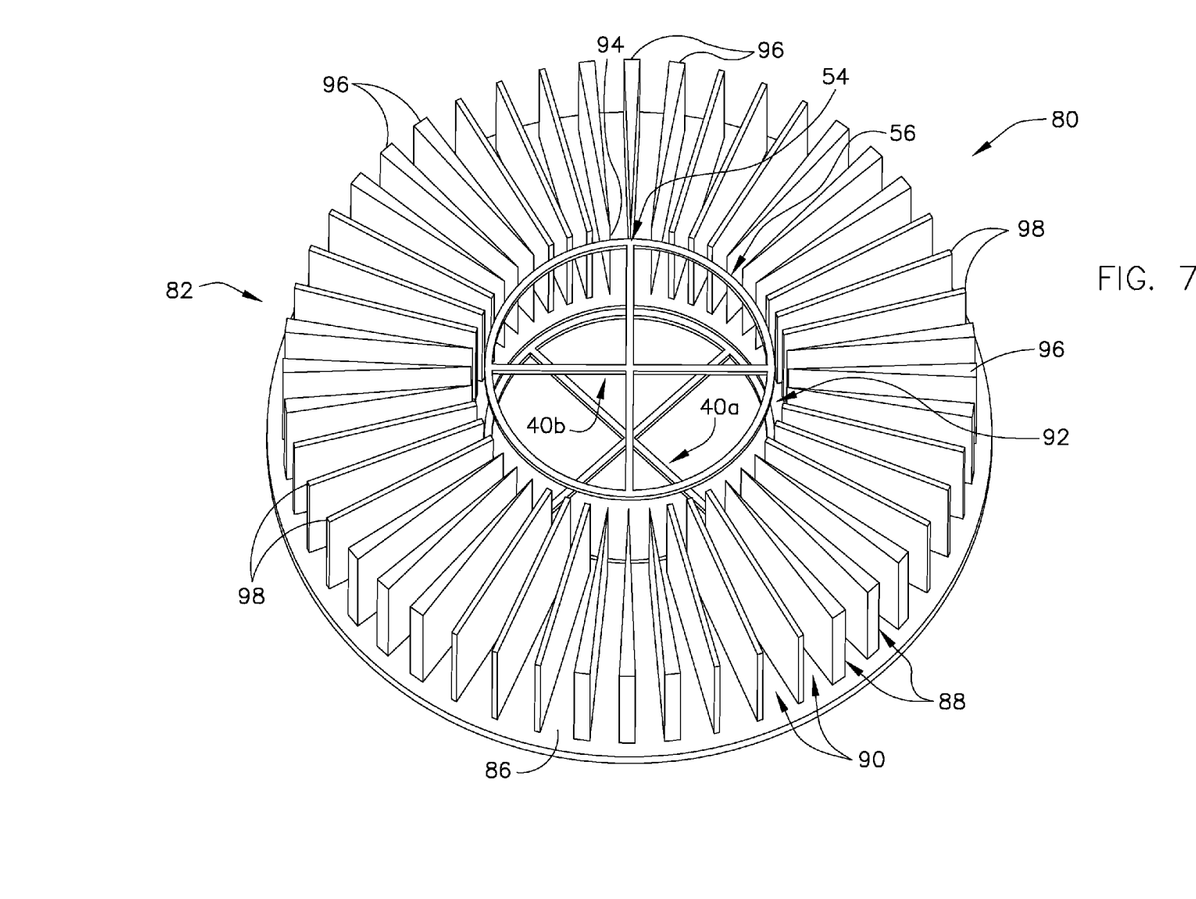
FIG. 7 is an illustration of a cooling system according to an embodiment of the invention.

Referring now to FIG. 7, a cooling system 80 is shown according to an embodiment of the invention. The cooling system 80 generally comprises a heat sink 82 and one or more synthetic jet actuators 40, such as that shown and described in FIG. 4. The cooling system 80 uses the synthetic jet actuators 40 in order to cool the heat sink 82, which, in turn, can be used to cool a heated body or environment, such as a circuit board or passive device (not shown).

The heat sink 82 of cooling system 80 is constructed of aluminum due to the relatively high thermal conductivity of aluminum. Alternatively, the heat sink 82 could be constructed from many other types of material, for example copper or a copper-aluminum combination, depending on the particular application of the cooling system 80. Typically, it is preferred that the material of the heat sink 82 be capable of effectively conducting thermal energy, e.g. heat. As depicted in FIG. 7, the heat sink 82 is generally formed to have a base 86 and a number of fins 88 extending from the heat sink base 86, which are spaced apart so as to define a plurality of channels 90. The base 86 is positioned near a heated body (not shown) to absorb thermal energy therefrom, and the series of fins 88 protrude out from the base 86 and away from the heated body to more effectively dissipate the thermal energy absorbed by the heat sink 82. That is, air or another suitable fluid is passed through each channel 90 formed between adjacent pairs of fins 88 to dissipate the heat/thermal energy in the fins 88.

As shown in FIG. 7, the fins 88 are positioned on the base 86 so as to generally define a hollow, central channel or area 92. That is, according to the embodiment of the invention, the fins 88 are attached to base 86 in a circular arrangement and spaced from the center of the base about a central channel 92 clear of fins 88. As further shown in FIG. 7, a pair of synthetic jet actuators 40 is positioned in the central channel 92 of heat sink 82 and the actuators 40 are arranged in a stacked configuration and spaced apart from base 86, according to an embodiment of the invention. While two synthetic jet actuators 40 are shown, it is also recognized that a single synthetic jet actuator 40 could be placed in central channel 92, or alternatively, that three or more synthetic jet actuators 40 could be placed in central channel 92. According to an embodiment of the invention, cooling system 80 can be formed as integral system by attaching/securing synthetic jet actuators 40 to fins 88 of heat sink 82 by way of a slot 94 formed in fins 88. It is also envisioned that mounting brackets or mechanisms (not shown) could be implemented for attaching/securing synthetic jet actuators 40 within central channel 92 of heat sink 82.

In addition, to be vertically spaced apart in central channel 92, each synthetic jet actuator 40 is rotated with respect to adjacent synthetic jet actuators 40. That is, in the embodiment of FIG. 7, the bottom synthetic jet actuator 40a is shown as having orifices 54 formed within outer wall 44 located every 90 degrees about the perimeter 56 of the synthetic jet actuator 40a. The top synthetic jet actuator 40b is positioned and rotated such that orifices 54 formed within outer wall 44 are located every 90 degrees about the perimeter 56 of the synthetic jet actuator 40b and are angularly offset from the orifices 54 of the bottom synthetic jet actuator 40a by 45 degrees. The combination of the top and bottom synthetic jet actuators 40a, 40b thus provides orifices 54 located every 45 degrees with respect to heat sink 82, thus providing for the generation and projection of fluid vortices by the synthetic jet actuators 40 at a greater number of locations.

The fluid vortices generated by the synthetic jet actuators 40, and projected out therefrom through orifices 54, are directed radially outward toward heat sink 82. At the locations of the orifices 54, the fluid vortices pass through the channels 90 of heat sink 82 to provide increased heat dissipation from the fins 88. According to an embodiment of the invention, and as shown in FIG. 7, the fins 88 of heat sink 82 are varied in shape. The fins located adjacent the orifices 54, and that form the channels 90 that receive the fluid vortices generated by the synthetic jet actuator(s) (i.e., a first portion of the channels), are triangular-shaped fins 96. The fins that are not located adjacent the orifices 54, and that form the channels 90 that do not receive fluid vortices generated by the synthetic jet actuator(s) (i.e., a second portion of the channels), are plate-shaped fins 98. The triangular-shaped fins 96 are designed to provide enhanced interaction with the radially outward flow of fluid vortices generated by synthetic jet actuator(s) 40. To further enhance heat dissipation by heat sink 82, the plate-shaped fins 98 promote the entraining of fluid (i.e., air) through channels 90 not receiving fluid vortices from synthetic jet actuator(s) 40. That is, the channels 90 formed by plate-shaped fins 98 ingest ambient air in a radially inward direction and into central channel 92 of heat sink 82.

Figure 8A:
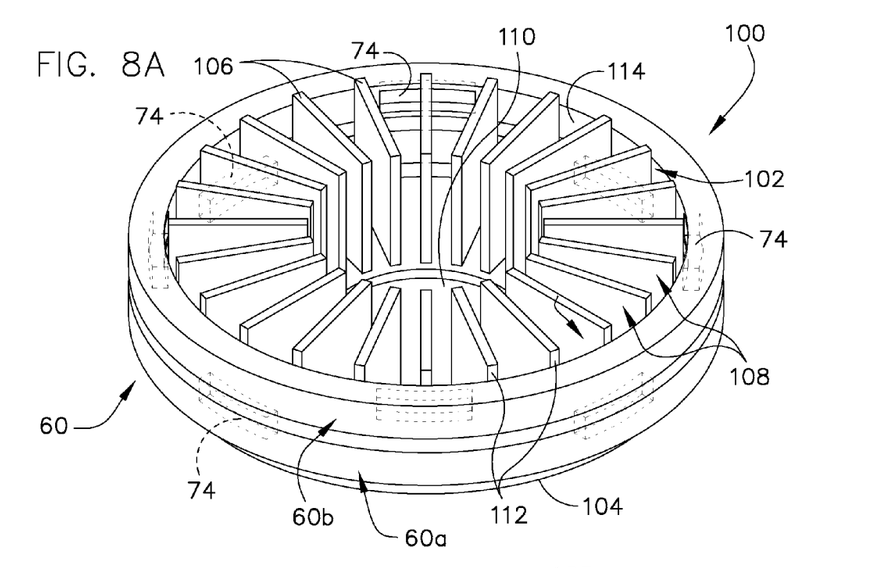
FIGS. 8A-8C are illustrations of a cooling system according to another embodiment of the invention.
Figure 8B:
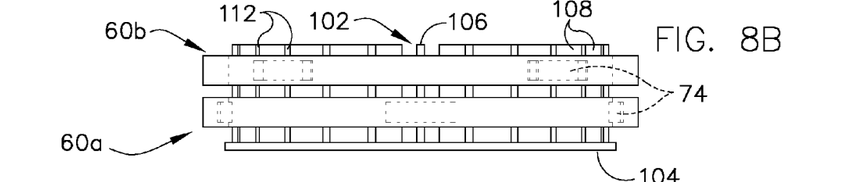
Figure 8C:
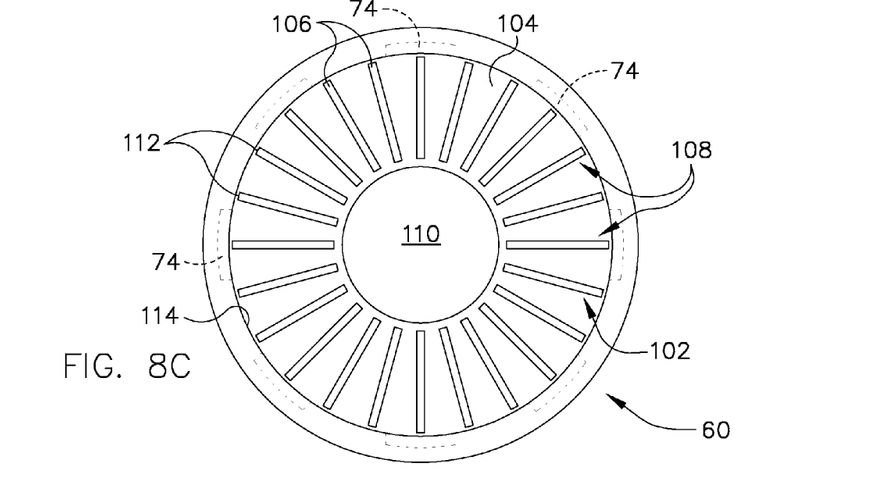

Referring now to FIGS. 8A-8C, a cooling system 100 is shown according to another embodiment of the invention. The cooling system 100 generally comprises a heat sink 102 and one or more synthetic jet actuators 60, such as that shown and described in FIGS. 5 and 6. The cooling system 100 uses the synthetic jet actuators 60 in order to cool the heat sink 102, which, in turn, can be used to cool a heated body or environment, such as a circuit board or passive device.

As depicted in FIG. 8, the heat sink 102 is generally formed to have a base 104 and a number of fins 106 extending from the heat sink base 104, which are spaced apart so as to define a plurality of channels 108. As shown in FIG. 8, the fins 106 are positioned on the base 104 so as to generally define a hollow, central channel or area 110. That is, according to the embodiment of the invention, the fins 106 are attached to base 104 in a circular arrangement and spaced from the center of the base about a central channel 110 clear of fins 106.

As further shown in FIG. 8, a pair of synthetic jet actuators 60 are positioned and configured to encircle or surround heat sink 102 and are arranged in a stacked configuration, according to an embodiment of the invention. While two synthetic jet actuators 60 are shown, it is also recognized that a single synthetic jet actuator could be used, or alternatively, that three or more synthetic jet actuators could be used to enhance cooling of heat sink. According to an embodiment of the invention, cooling system 100 can be formed as integral system by attaching/securing synthetic jet actuators to fins 106 of heat sink 102 by way of a slot 112 formed in the fins. It is also envisioned that mounting brackets or mechanisms (not shown) could be implemented for attaching/securing synthetic jet actuators 60 to fins 106 of heat sink 102.

In addition, to being vertically spaced apart, each synthetic jet actuator 60 is rotated with respect to adjacent synthetic jet actuators 60. That is, in the embodiment of FIG. 8, the bottom synthetic jet actuator 60a is shown as having orifices 74 formed within inner wall 62 located every 90 degrees about an inner perimeter 114 of the synthetic jet actuator 60. The top synthetic jet actuator 60b is positioned and rotated such that orifices 74 formed within inner wall 62 are located every 90 degrees about the inner perimeter 114 of the synthetic jet actuator 60b, but are angularly offset from the orifices 74 of the bottom synthetic jet actuator 60a by 45 degrees. The combination of the top and bottom synthetic jet actuators 60a, 60b thus provides orifices located every 45 degrees about the heat sink 102, thus providing for the generation and projection of fluid vortices by the synthetic jet actuators 60 at a greater number of locations.

The fluid vortices generated by the synthetic jet actuators 60, and projected out therefrom through orifices 74, are directed radially inward toward heat sink 102. At the locations of the orifices 74, the fluid vortices pass through the channels 108 of heat sink 102, exiting the channels 108 into central channel 110 to provide increased heat dissipation from the fins 106. According to an embodiment of the invention, and as shown in FIG. 8, the fins 106 of heat sink 102 are plate-shaped, although it is also envisioned that the plurality of fins 106 could have a different shape, or be varied in shape such as the fins shown and described in FIG. 7.

Figure 9:
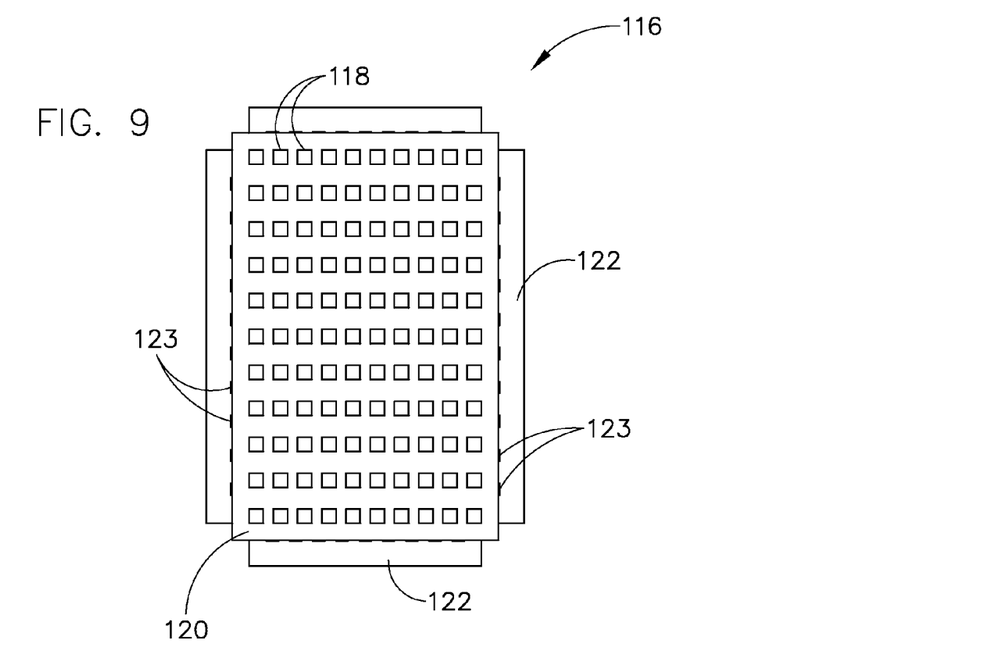
FIG. 9 is an illustration of a cooling system according to another embodiment of the invention.

It is recognized that additional embodiments of the invention could incorporate heat sinks having varying configurations. As shown in FIG. 9, a heat sink 116 could include a plurality of pin-shaped fins 118 mounted on a base 120 and spaced apart to provide channels for fluid flow therethrough. The heat sink 116 is shown as being rectangular in shape, but it is envisioned that a circular, oval, or other geometric shape heat sink could also be implemented. To enhance cooling of an electronic device (not shown) to which heat sink 116 is mounted, synthetic jet actuators 122 are attached thereto, such as by way of slots (not shown) formed on fins 118 about an outer perimeter of the heat sink. In the embodiment of FIG. 9, synthetic jet actuators 122 are positioned/attached on each side of the heat sink 116, although it is also recognized that synthetic jet actuators 122 could be attached on only two sides of the heat sink 116. Additionally, it is recognized that a single synthetic jet actuator 122 having an opening in the middle thereof, similar to the synthetic jet actuator shown and described in FIG. 5, could be implemented and positioned about (i.e., surrounding) heat sink 116. Selective operation of the synthetic jet actuator(s) 122 would then generate and project fluid vortices out from orifices 123 of the synthetic jet actuator(s) 122 to provide fluid flow across the fins 118 and enhance cooling.

Figure 10:
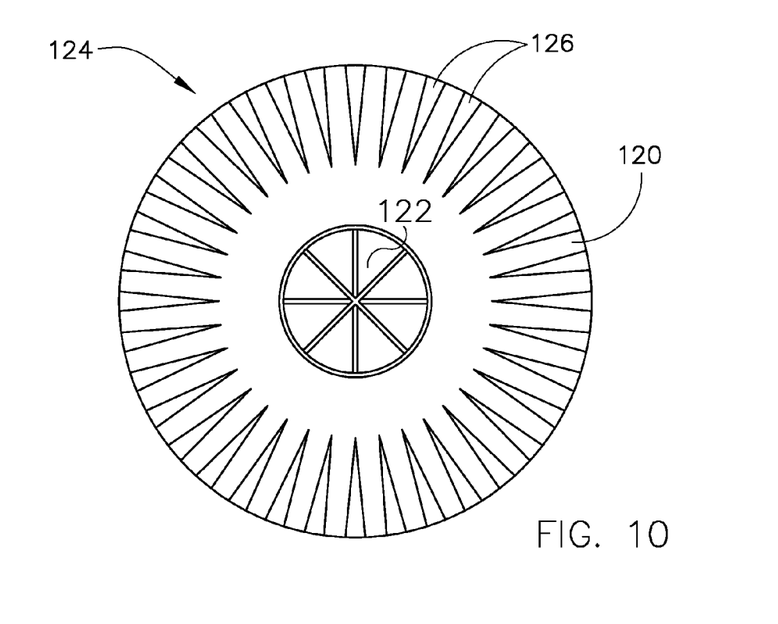
FIG. 10 is a top view of a heat sink for use with a cooling system, according to an embodiment of the invention.

As shown in FIG. 10, according to another embodiment, a heat sink 124 includes a plurality of triangular-shaped fins 126 mounted on a base 120 and surrounding and defining a central channel 122. It is also envisioned that heat sinks having a hybrid design could be used, which have, for example, a plurality of pin-shaped fins mixed with a plurality of plate shaped or triangular-shaped fins. Each of these heat sinks could incorporate and be integrally connected to one or more synthetic jet actuators, such as those shown and described in FIGS. 4-5, so as to form cooling systems according to embodiments of the invention.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

Therefore, according to one embodiment of the invention, a cooling system includes a heat sink comprising a base portion and a plurality of fins disposed on the base portion and extending vertically out therefrom, the plurality of fins spaced to define a channel between adjacent fins. The cooling system also includes at least one synthetic jet actuator attached to the heat sink, with each of the at least one synthetic jet actuators comprising a plurality of orifices therein and being configured to generate and project a series of fluid vortices out from the plurality of orifices and toward at least a portion of the channels of the heat sink.

According to another embodiment of the invention, a method of cooling a heat generating device includes the steps of providing a heat sink comprising a plurality of fins positioned to define a plurality of channels in the heat sink, attaching a synthetic jet actuator to the plurality of fins, the synthetic jet actuator having a plurality of orifices formed therein, and generating a series of fluid vortices from the synthetic jet actuator. The method also includes the step of projecting the series of fluid vortices out from the plurality of orifices of the synthetic jet actuator and toward the plurality of fins and channels of the heat sink, wherein the series of fluid vortices are projected out from the plurality of orifices toward the plurality of fins and channels of the heat sink at a plurality of angles.

According to yet another embodiment of the invention, a cooling system includes a heat sink comprising a base portion and a plurality of fins disposed on the base portion and extending vertically out therefrom to define a plurality of channels, wherein the plurality of fins are positioned on the base portion to surround a central channel. The cooling system also includes a synthetic jet actuator integrally attached to the heat sink and positioned in the central channel, the synthetic jet actuator further including a chamber having walls enclosing a volume, a plurality of orifices formed in the walls, and an actuator element coupled to at least one of the walls to selectively cause deflection thereof, thereby changing a volume within the chamber so that a series of fluid vortices are generated and projected out from the plurality of orifices and toward the plurality of channels of the heat sink.

What is claimed as new and desired to be protected by Letters Patent of the United States is:

1. A cooling device comprising:
   a heat sink comprising a base portion and a plurality of pin-shaped fins disposed on the base portion and extending vertically out therefrom, the plurality of pin-shaped fins being spaced to define channels for fluid flow therethrough; and
   a plurality of synthetic jet actuators attached to the heat sink on at least two different sides of the heat sink, each of the at plurality of synthetic jet actuators comprising a plurality of orifices therein and being configured to generate and project a series of fluid vortices out from the plurality of orifices and toward the plurality of pin-shaped fins of the heat sink.

2. The cooling device of claim 1 wherein the plurality of pin-shaped fins are positioned to define a plurality of rows of fins on the heat sink.

3. The cooling device of claim 1 wherein the heat sink comprises a rectangular shaped heat sink.

4. The cooling device of claim 3 wherein the plurality of synthetic jet actuators comprises a pair of synthetic jet actuators positioned on opposing sides of the rectangular shaped heat sink.

5. The cooling device of claim 3 wherein the plurality of synthetic jet actuators comprises four synthetic jet actuators positioned on four sides of the rectangular shaped heat sink.

6. The cooling device of claim 1 wherein the plurality of orifices in each of the plurality of synthetic jet actuators are aligned with the channels defined by the plurality of pin-shaped fins.

7. A cooling device comprising:
   a heat sink comprising a base portion and a plurality of pin-shaped fins disposed on the base portion and extending vertically out therefrom, the plurality of pin-shaped fins being spaced to define channels for fluid flow therethrough; and
   a plurality of synthetic jet actuators attached to the heat sink on at least two different sides of the heat sink so as to at least partially surround that heat sink, each of the plurality of synthetic jet actuators comprising a plurality of orifices therein and being configured to generate and project a series of fluid vortices out from the plurality of orifices and toward the plurality of pin-shaped fins of the heat sink.

8. The cooling device of claim 7 wherein the plurality of pin-shaped fins are positioned to define a plurality of rows of fins on the heat sink.

9. The cooling device of claim 7 wherein the heat sink comprises a rectangular shaped heat sink.

10. The cooling device of claim 8 wherein the plurality of synthetic jet actuators comprises a pair of synthetic jet actuators positioned on opposing sides of the rectangular shaped heat sink.

11. The cooling device of claim 7 wherein the plurality of synthetic jet actuators comprises four synthetic jet actuators positioned on four sides of the rectangular shaped heat sink.

12. The cooling device of claim 1 wherein the plurality of orifices in each of the plurality of synthetic jet actuators are aligned with the channels defined by the plurality of pin-shaped fins.

13. A cooling device comprising:
   a heat sink comprising a base portion and a plurality of pin-shaped fins disposed on the base portion and extending vertically out therefrom to define a plurality of channels; and
   a synthetic jet actuator attached to the heat sink and configured so as to be positioned thereabout, the synthetic jet actuator comprising a plurality of orifices therein and being configured to generate and project a series of fluid vortices out from the plurality of orifices and toward the plurality of pin-shaped fins of the heat sink from different directions.

14. A cooling device comprising:
   a heat sink comprising a base portion and a plurality of pin-shaped fins disposed on the base portion and extending vertically out therefrom, the base portion having a plurality of sides; and
   a plurality of synthetic jet actuators attached to the heat sink on at least two adjacent sides of the plurality of sides of the heat sink, each of the plurality of synthetic jet actuators comprising a plurality of orifices therein and being configured to generate and project a series of fluid vortices out from the plurality of orifices and toward the plurality of pin-shaped fins of the heat sink.

* * * * *